United States Patent
Kuo et al.

(10) Patent No.: US 12,376,395 B2
(45) Date of Patent: Jul. 29, 2025

(54) OPTICAL DEVICES

(71) Applicant: VisEra Technologies Company Limited, Hsin-Chu (TW)

(72) Inventors: Shin-Hong Kuo, Hsin-Chu (TW); Han-Lin Wu, Hsin-Chu (TW); Ta-Yung Ni, Hsin-Chu (TW); Ching-Chiang Wu, Hsin-Chu (TW); Zong-Ru Tu, Hsin-Chu (TW); Yu-Chi Chang, Hsin-Chu (TW); Hung-Jen Tsai, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 655 days.

(21) Appl. No.: 17/563,664

(22) Filed: Dec. 28, 2021

(65) Prior Publication Data

US 2022/0302182 A1    Sep. 22, 2022

Related U.S. Application Data

(60) Provisional application No. 63/162,760, filed on Mar. 18, 2021.

(51) Int. Cl.
  *H01L 27/146*   (2006.01)
  *H10F 39/00*    (2025.01)
(52) U.S. Cl.
  CPC ....... *H10F 39/8033* (2025.01); *H10F 39/026* (2025.01); *H10F 39/8023* (2025.01); *H10F 39/8053* (2025.01); *H10F 39/8063* (2025.01)
(58) Field of Classification Search
  CPC ..... H01L 27/14; H01L 27/144; H01L 27/146; H01L 27/14601; H01L 27/14603;
  (Continued)

(56) References Cited

U.S. PATENT DOCUMENTS

| | | | | |
|---|---|---|---|---|
| 4,694,185 A | * | 9/1987 | Weiss | H01L 31/02325 257/E31.128 |
| 7,643,213 B2 | * | 1/2010 | Boettiger | B29D 11/00365 359/619 |

(Continued)

FOREIGN PATENT DOCUMENTS

| | | |
|---|---|---|
| CN | 112406014 A | 2/2021 |
| JP | H06326285 | 11/1994 |

(Continued)

OTHER PUBLICATIONS

Taiwanese Office Action with the search report of its corresponding TW application No. 111108331 issued on Mar. 17, 2023; pp. 1-9.

*Primary Examiner* — John R Lee

(74) *Attorney, Agent, or Firm* — Muncy, Geissler, Olds & Lowe, P.C.

(57) ABSTRACT

An optical device is provided. The optical device includes a substrate and a plurality of optical structures. The substrate includes a plurality of photoelectric conversion elements. The optical structures are disposed above the substrate. Each optical structure corresponds to one photoelectric conversion element. Each optical structure includes a first portion and a second portion. The first portion has a first glass transition temperature. The second portion has a second glass transition temperature. The second portion guides the incident light into the photoelectric conversion element. The first glass transition temperature is higher than the second glass transition temperature.

15 Claims, 13 Drawing Sheets

(58) Field of Classification Search
CPC ......... H01L 27/14605; H01L 27/14607; H01L 27/14609; H01L 27/1461; H01L 27/1462; H01L 27/14621; H01L 27/14625; H01L 27/14627; H01L 27/14632
See application file for complete search history.

(56) References Cited

U.S. PATENT DOCUMENTS

| | | | | |
|---|---|---|---|---|
| 7,928,527 | B2* | 4/2011 | Gambino | H01L 27/1463 257/432 |
| 7,978,411 | B2* | 7/2011 | Li | H01L 27/14627 359/622 |
| 7,986,019 | B2* | 7/2011 | Matsushita | H01L 27/14627 257/E31.127 |
| 8,647,913 | B2* | 2/2014 | Adkisson | H01L 27/14685 257/431 |
| 8,795,559 | B2* | 8/2014 | Li | G02B 3/0018 264/1.7 |
| 10,192,916 | B2* | 1/2019 | Huang | H01L 27/14627 |
| 10,804,306 | B2* | 10/2020 | Huang | H01L 27/14627 |
| 11,387,278 | B2* | 7/2022 | Heo | H10K 30/88 |
| 11,569,291 | B2* | 1/2023 | Lin | H01L 27/14627 |
| 11,789,198 | B2* | 10/2023 | Lin | G02B 27/0172 385/131 |
| 11,894,403 | B2* | 2/2024 | Kim | C08K 3/36 |
| 12,100,724 | B2* | 9/2024 | Shikahama | G02B 3/0068 |
| 2002/0162943 | A1* | 11/2002 | Lee | B29D 11/00442 257/E27.131 |
| 2003/0168679 | A1* | 9/2003 | Nakai | H01L 27/14685 257/292 |
| 2005/0078377 | A1* | 4/2005 | Li | B29D 11/00365 359/619 |
| 2005/0242271 | A1* | 11/2005 | Weng | H01L 27/14625 250/214.1 |
| 2006/0152813 | A1 | 7/2006 | Boettiger et al. | |
| 2009/0034083 | A1* | 2/2009 | Li | G02B 3/0031 359/619 |
| 2009/0224348 | A1* | 9/2009 | Matsushita | H01L 27/14627 257/E31.127 |
| 2015/0053860 | A1* | 2/2015 | Duane | H01L 27/14669 257/432 |
| 2016/0013233 | A1* | 1/2016 | Noudo | H01L 27/1464 438/69 |
| 2016/0350445 | A1* | 12/2016 | Dowski, Jr. | H04N 23/57 |
| 2018/0292586 | A1* | 10/2018 | Hitomi | C08K 5/54 |
| 2018/0358397 | A1* | 12/2018 | Huang | H01L 27/14627 |
| 2019/0018246 | A1 | 1/2019 | Kogure | |
| 2019/0123087 | A1* | 4/2019 | Huang | H01L 27/14627 |
| 2019/0258019 | A1* | 8/2019 | Ohara | G02B 13/0025 |
| 2022/0139996 | A1* | 5/2022 | Lin | H01L 27/14685 257/432 |
| 2022/0302182 | A1* | 9/2022 | Kuo | H01L 27/14627 |
| 2023/0102094 | A1* | 3/2023 | Lin | H01L 27/14627 257/432 |

FOREIGN PATENT DOCUMENTS

| | | |
|---|---|---|
| JP | 2002261261 | 9/2002 |
| JP | 2004140426 | 5/2004 |
| JP | 2007208059 | 8/2007 |
| JP | 2007335723 | 12/2007 |
| JP | 2009537032 | 10/2009 |
| JP | 2016118675 | 6/2016 |
| TW | 200917820 A | 4/2009 |
| TW | 200918953 A | 5/2009 |
| TW | I370264 B | 8/2012 |
| TW | 201727943 A | 8/2017 |
| TW | I699023 B | 7/2020 |
| WO | WO2016190246 A1 | 12/2016 |
| WO | WO2020145218 | 7/2020 |

* cited by examiner

OPTICAL DEVICES

CROSS REFERENCE TO RELATED APPLICATIONS

This application claims the benefit of U.S. Provisional Application No. 63/162,760, filed on Mar. 18, 2021, the entirety of which is incorporated by reference herein.

BACKGROUND OF THE INVENTION

Field of the Invention

The invention relates to an optical device, and more particularly to an optical device with a dual optical micro structure.

Description of the Related Art

When rays from a camera module lens enter a CMOS image sensor (CIS), there will be a wide chief ray angle (CRA) at the edge of the CIS. The color performance and image quality will be bad in low-light conditions because the photodiodes of the CIS cannot receive light efficiently.

BRIEF SUMMARY OF THE INVENTION

In accordance with one embodiment of the invention, an optical device is provided. The optical device includes a substrate and a plurality of optical structures. The substrate includes a plurality of photoelectric conversion elements. The optical structures are disposed above the substrate. Each optical structure corresponds to one photoelectric conversion element. Each optical structure includes a first portion and a second portion. The first portion has a first glass transition temperature. The second portion has a second glass transition temperature. The second portion guides the incident light into the photoelectric conversion element. The first glass transition temperature is higher than the second glass transition temperature.

In some embodiments, the first portion and the second portion are disposed on the same plane.

In some embodiments, the first glass transition temperature of the first portion is smaller than or equal to 350° C. and greater than or equal to 70° C. In some embodiments, the second glass transition temperature of the second portion is smaller than or equal to 300° C. and greater than or equal to 50° C. In some embodiments, the first portion has a refractive index which is lower than or equal to 2.9 and greater than 1. In some embodiments, the second portion has a refractive index which is lower than or equal to 2.8 and greater than 1.1.

In some embodiments, the first portion includes a rectangle, a triangle, an isosceles trapezoid or an irregular trapezoid from a cross-sectional view. In some embodiments, the second portion has an aspherical surface from a cross-sectional view. In some embodiments, the second portion has a flat surface, a convex surface or a concave surface from a cross-sectional view.

In some embodiments, the first portion surrounds the second portion. In some embodiments, the first portion includes a closed ring from a top view. In some embodiments, when the first portion is a closed ring, the first portion includes a circular ring-shaped opening, a square ring-shaped opening, an elliptical ring-shaped opening or an aspherical ring-shaped opening from a top view. In some embodiments, the second portion partially covers the first portion.

In some embodiments, the first portion includes a U shape, an L shape, an irregular shape with a curved surface, a rectangle or a triangle from a top view.

In some embodiments, when the first portion includes a columnar structure, the second portion fully covers the first portion. In some embodiments, the first portion includes a cylinder, a cone, a single square column or multiple square columns. In some embodiments, the first portion includes a stack of multiple square columns or a stack of multiple cylinders.

In some embodiments, the substrate includes a first region, a second region and a third region from the center to the edge of the substrate. In some embodiments, the first portion of each optical structure disposed within the first region has a first height, the first portion of each optical structure disposed within the second region has a second height and the first portion of each optical structure disposed within the third region has a third height, and the third height is higher than the second height, and the second height is higher than the first height. In some embodiments, when the second portion of each optical structure has a spherical surface, the second portion of each optical structure disposed within the first region has a first curvature, the second portion of each optical structure disposed within the second region has a second curvature and the second portion of each optical structure disposed within the third region has a third curvature, and the third curvature is greater than the second curvature, and the second curvature is greater than the first curvature. In some embodiments, when the second portion of each optical structure has an inclined surface, the second portion of each optical structure disposed within the first region has a first slope, the second portion of each optical structure disposed within the second region has a second slope and the second portion of each optical structure disposed within the third region has a third slope, and the third slope is greater than the second slope, and the second slope is greater than the first slope.

In some embodiments, the photoelectric conversion elements have a first edge and the outermost optical structure has a second edge, and the first edge and the second edge have a distance therebetween.

In some embodiments, the optical device further includes a plurality of color filters disposed between the substrate and the optical structures. In some embodiments, the optical device further includes a plurality of microlenses disposed between the color filters and the optical structures.

In some embodiments, angle $\phi$ is defined as the angle between a connecting line connecting the center of the substrate with the center of mass of the optical structure in a pixel and a horizontal line passing through the center of the substrate from a top view. In some embodiments, when the first portion surrounds the second portion and the first portion is a closed ring, as the angle $\phi$ changes, the first portion has the same relative position in each pixel, and the position of the second portion changes with the angle $\phi$ in each pixel. In some embodiments, when the first portion is a columnar structure and the second portion fully covers the first portion, as the angle $\phi$ changes, the first portion and the second portion have different relative positions with the angle $\phi$ in each pixel.

In accordance with one embodiment of the invention, a method for fabricating an optical device is provided. The fabrication method includes the following steps. A substrate is provided. A first material having a first glass transition temperature is formed above the substrate. A second material having a second glass transition temperature is formed above the substrate. The first glass transition temperature is higher than the second glass transition temperature. A heating process is performed to form a plurality of optical structures.

In some embodiments, the heating process includes lamp irradiation, laser irradiation, electricity conduction or liquid dissolving. In some embodiments, the liquid dissolving includes physical etching or chemical etching. In some embodiments, the fabrication method further includes adjusting a volume or a height of the second material before the heating process. In some embodiments, the heating process includes applying different levels of heating energy. In some embodiments, the fabrication method further includes performing an etching process after the heating process.

In the present invention, the specific dual optical micro structures (with adjustable locations, profiles, dimensions and combinations of components) are arranged above the photoelectric conversion elements of the CMOS image sensor (CIS). The dual optical micro structures can improve the light receiving efficiency and reduce cross-talk in the CIS.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
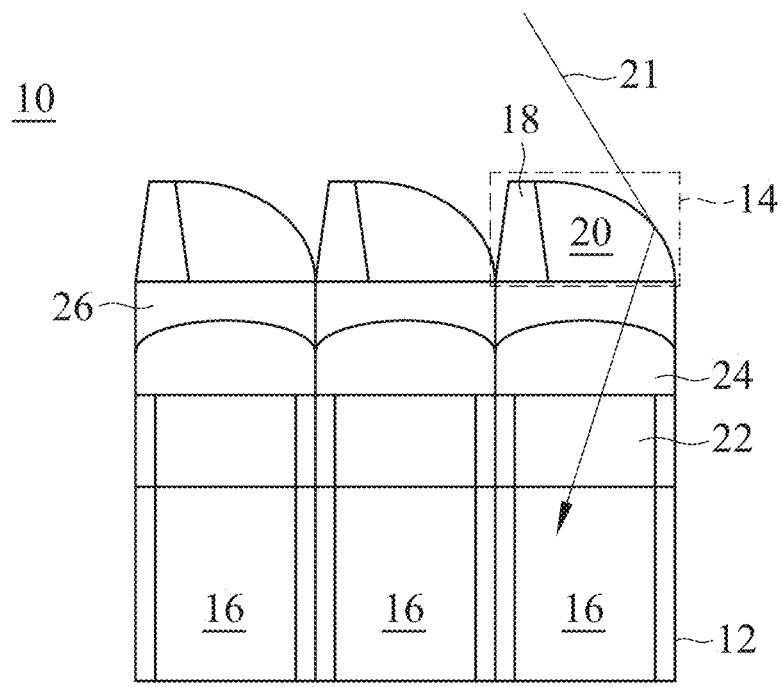
FIG. 1 shows a cross-sectional view of an optical device in accordance with one embodiment of the present invention.

The optical device of the present invention is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In the description, relative terms such as "lower," "upper," "horizontal," "vertical,", "above," "below," "up," "down," "top" and "bottom" as well as derivative thereof (e.g., "horizontally." "downwardly," "upwardly," etc.) should be construed as referring to the orientation as described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

Herein, the terms "about", "around" and "substantially" typically mean +/−20% of the stated value or range, typically +/−10% of the stated value or range, typically +/−5% of the stated value or range, typically +/−3% of the stated value or range, typically +/−2% of the stated value or range, typically +/−1% of the stated value or range, and typically +/−0.5% of the stated value or range. The stated value of the present disclosure is an approximate value. Namely, the meaning of "about", "around" and "substantially" may be implied if there is no specific description of "about", "around" and "substantially".

The following description is of the best-contemplated mode of carrying out the invention. This description is made for the purpose of illustrating the general principles of the invention and should not be taken in a limiting sense. The scope of the invention is best determined by reference to the appended claims.

Referring to FIG. 1, in accordance with one embodiment of the present invention, an optical device 10 is provided. FIG. 1 shows a cross-sectional view of the optical device 10.

As shown in FIG. 1, the optical device 10 includes a substrate 12 and a plurality of optical structures 14. The substrate 12 includes a plurality of photoelectric conversion elements 16. The optical structures 14 are disposed above the substrate 12. Each optical structure 14 corresponds to one photoelectric conversion element 16. Each optical structure 14 includes a first portion 18 and a second portion 20. The first portion 18 has a first glass transition temperature. The second portion 20 has a second glass transition temperature. The second portion 20 guides the incident light 21 into the photoelectric conversion element 16. The first glass transition temperature is higher than the second glass transition temperature.

In some embodiments, the optical device 10 optionally includes a plurality of color filters 22 disposed between the substrate 12 and the optical structures 14. In some embodiments, the optical device 10 optionally includes a plurality of microlenses 24 disposed between the color filters 22 and the optical structures 14. In some embodiments, the optical device 10 optionally includes a planarization layer 26 disposed between the microlenses 24 and the optical structures 14.

In some embodiments, the first portion 18 and the second portion 20 are disposed on the same plane, for example, the first portion 18 and the second portion 20 are disposed on the planarization layer 26.

In some embodiments, the first glass transition temperature of the first portion 18 is smaller than or equal to about 350° C. and greater than or equal to about 70° C. In some embodiments, the second glass transition temperature of the second portion 20 is smaller than or equal to about 300° C. and greater than or equal to about 50° C. The material of the first portion 18 is different from that of the second portion 20 due to different glass transition temperatures therebetween. In some embodiments, the first portion 18 has a refractive index which is lower than or equal to about 2.9 and greater than about 1. In some embodiments, the second portion 20 has a refractive index which is lower than or equal to about 2.8 and greater than about 1.1.

Figure 2:
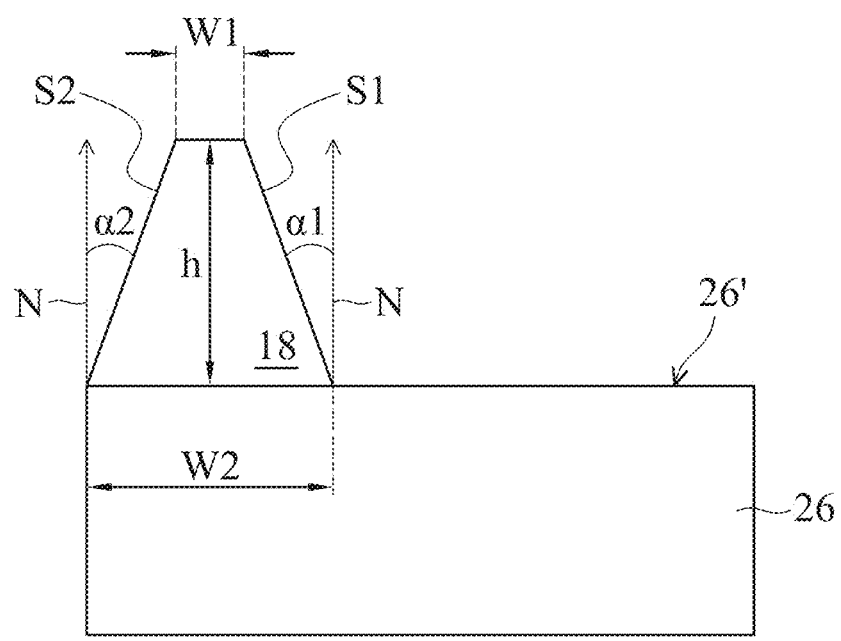
FIG. 2 shows a cross-sectional view of a profile of a first portion of an optical structure in accordance with one embodiment of the present invention.

Referring to FIG. 2, in accordance with one embodiment of the present invention, a profile of a first portion 18 of an optical structure 14 is provided. FIG. 2 shows a cross-sectional view of the profile of the first portion 18 of the optical structure 14. The relationship between the profile of the first portion 18 of the optical structure 14 and the related dimensions, for example, top width, bottom width, height and angle between sidewall and normal line, is shown in this figure. That is, the profile of the first portion 18 is determined by the related dimensions.

As shown in FIG. 2, the first portion 18 disposed on, for example, the planarization layer 26 is exemplary. The top width of the first portion 18 is represented as "W1". The bottom width of the first portion 18 is represented as "W2". The angle between the right sidewall S1 of the first portion 18 and the normal line N of the top surface 26' of the planarization layer 26 is represented as "α1". The angle between the left sidewall S2 of the first portion 18 and the normal line N of the top surface 26' of the planarization layer 26 is represented as "α2". The height of the first portion 18 is represented as "h". In some embodiments, the top width "W1" of the first portion 18 is smaller than or equal to about 500 nm and greater than or equal to about zero. In some embodiments, the bottom width "W2" of the first portion 18 is smaller than or equal to about 500 nm and greater than or equal to about 10 nm. In some embodiments, the angle "α1" between the right sidewall S1 of the first portion 18 and the normal line N of the top surface 26' of the planarization layer 26 is smaller than about 90 degrees and greater than or equal to about zero degrees. In some embodiments, the angle "α2" between the left sidewall S2 of the first portion 18 and the normal line N of the top surface 26' of the planarization layer 26 is smaller than about 90 degrees and greater than or equal to about zero degrees. In some embodiments, the height "h" of the first portion 18 is greater than or equal to about 50 nm. The dimensions mentioned above (i.e. the top width, the bottom width, the height and the angle between the sidewalls and the normal line) determine the profile of the first portion 18.

Referring to FIGS. 3A-3D, in accordance with various embodiments of the present invention, various profiles of a first portion 18 of an optical structure 14 are provided. FIGS. 3A-3D show cross-sectional views of the profiles of the first portion 18 of the optical structure 14.

Figure 3A:
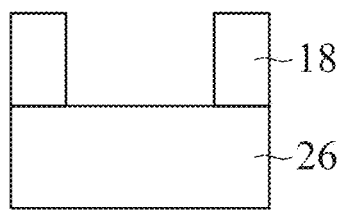
FIGS. 3A-3D show cross-sectional views of profiles of a first portion of an optical structure in accordance with various embodiments of the present invention.

In some embodiments, when W1=W2 and α1=α2=0, the first portion 18 shows a rectangular profile from a cross-sectional view, as shown in FIG. 3A.

Figure 3B:
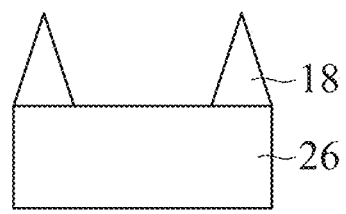

In some embodiments, when W1=0 and α1=α2, the first portion 18 shows a triangle profile from a cross-sectional view, as shown in FIG. 3B.

Figure 3C:
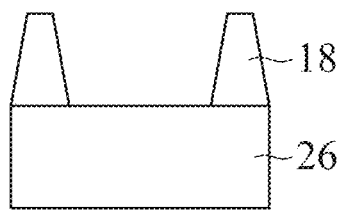

In some embodiments, when W2>W1>0 and α1=α2, the first portion 18 shows an isosceles trapezoid profile from a cross-sectional view, as shown in FIG. 3C.

Figure 3D:
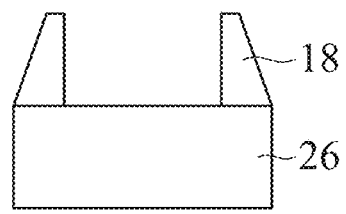

In some embodiments, W2>W1>0 and α1≠α2, the first portion 18 shows an irregular trapezoid profile from a cross-sectional view, as shown in FIG. 3D.

Referring to FIGS. 4A-4D, in accordance with various embodiments of the present invention, various profiles of a second portion 20 of an optical structure 14 are provided. FIGS. 4A-4D show cross-sectional views of the profiles of the second portion 20 of the optical structure 14.

Figure 4A:
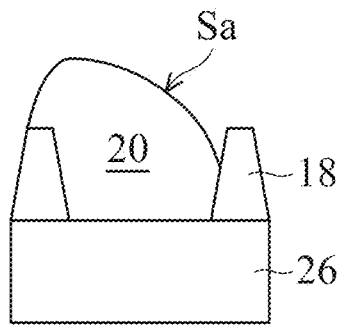
FIGS. 4A-4E show cross-sectional views of profiles of a second portion of an optical structure in accordance with various embodiments of the present invention.

In some embodiments, as shown in FIG. 4A, the second portion 20 has an aspherical surface "Sa" (convex surface) profile with a greater curvature from a cross-sectional view.

Figure 4B:
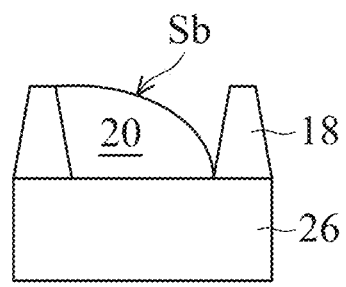

In some embodiments, as shown in FIG. 4B, the second portion 20 has an aspherical surface "Sb" (convex surface) profile with a smaller curvature relative to "Sa" from a cross-sectional view. That is, the second portion 20 includes aspherical surfaces with different curvatures.

Figure 4C:
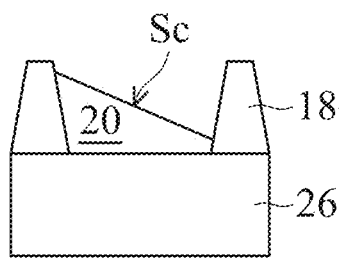

In some embodiments, as shown in FIG. 4C, the second portion 20 has an inclined surface "Sc" profile from a cross-sectional view.

Figure 4D:
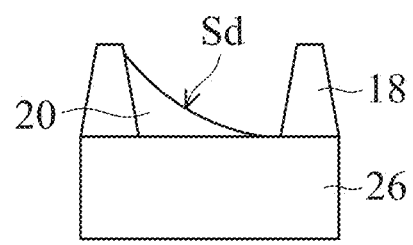

In some embodiments, as shown in FIG. 4D, the second portion 20 has a concave surface "Sd" profile from a cross-sectional view.

Figure 4E:
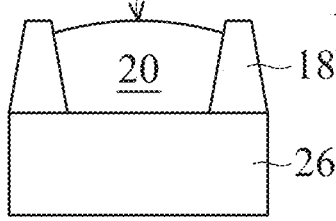

In some embodiments, as shown in FIG. 4E, the second portion 20 has a flat surface "Se" profile from a cross-sectional view.

Figure 5:
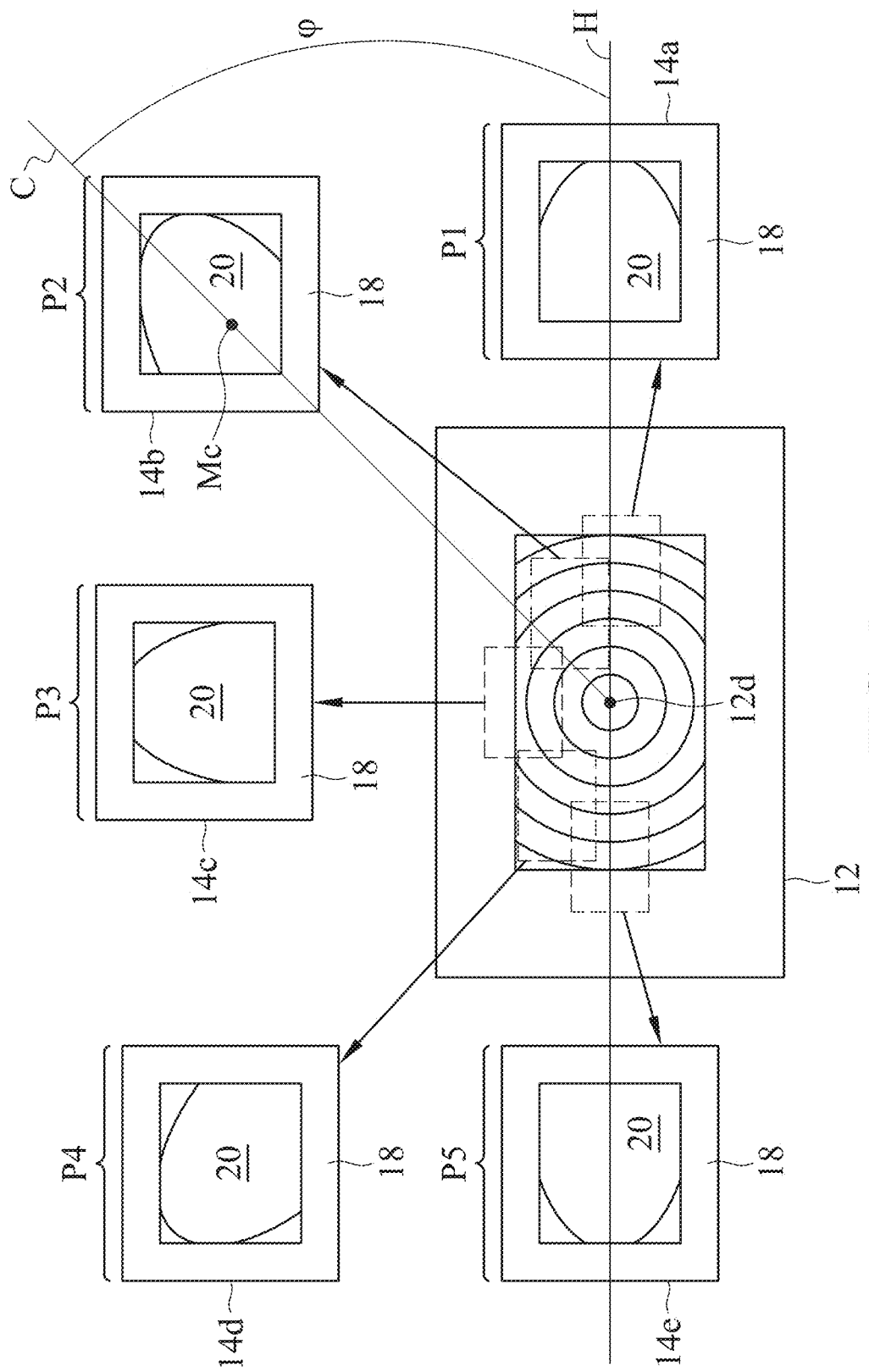
FIG. 5 shows a top view of arrangements of optical structures in pixels in accordance with one embodiment of the present invention.

Referring to FIG. 5, in accordance with one embodiment of the present invention, various arrangements of optical structures (for example, 14a, 14b, 14c, 14d and 14e are exemplary) in pixels (for example, P1, P2, P3, P4 and P5 are exemplary) are provided. FIG. 5 shows a top view of the arrangements of the optical structures in the pixels.

As shown in FIG. 5, the optical structures (14a, 14b, 14c, 14d and 14e) are arranged on a substrate 12. The pixel P2 is exemplary to define angle ϕ. Angle ϕ is defined as the angle between a connecting line C connecting the center 12d of the substrate 12 with the center Mc of mass of the optical structure 14b in the pixel P2 and a horizontal line H passing through the center 12d of the substrate 12. In FIG. 5, the first portion 18 surrounds the second portion 20 and the first portion 18 is a closed ring. As the angle ϕ changes, the first portion 18 of the optical structure (14a, 14b, 14c, 14d or 14e) has the same relative position in each pixel, and the position of the second portion 20 of the optical structure (14a, 14b, 14c, 14d or 14e) changes with the angle ϕ in each pixel. For example, in the pixel P1, the angle ϕ is zero degrees, and the optical structure 14a is arranged in such a way that ϕ=0°. In the pixel P2, the angle ϕ is 45 degrees, and the optical structure 14b is arranged in such a way that ϕ=45°. In the pixel P3, the angle ϕ is 90 degrees, and the optical structure 14c is arranged in such a way that ϕ=90°. In the pixel P4, the angle ϕ is 135 degrees, and the optical structure 14d is arranged in such a way that ϕ=135°. In the pixel P5, the angle ϕ is 180 degrees, and the optical structure 14e is arranged in such a way that ϕ=180°.

In some embodiments, when the first portion is a columnar structure and the second portion fully covers the first portion, as the angle ϕ changes, the first portion and the second portion of the optical structure have different relative positions with the angle ϕ in each pixel (not shown).

Referring to FIGS. 6A-6D, in accordance with various embodiments of the present invention, various arrangements of a first portion 18 and a second portion 20 of an optical structure 14 are provided. FIGS. 6A-6D show top views of the arrangements of the first portion 18 and the second portion 20 of the optical structure 14.

In FIGS. 6A-6D, the first portion 18 surrounds the second portion 20, and the first portion 18 includes a closed ring, for example, a closed ring having a square ring-shaped opening 18'. The second portion 20 partially covers the first portion 18.

Figure 6A:
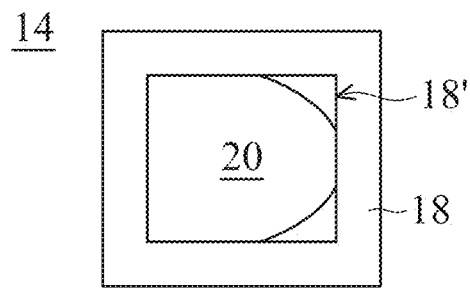
FIGS. 6A-6D show top views of arrangements of a first portion and a second portion of an optical structure in accordance with various embodiments of the present invention.

When the angle φ is zero degrees, the arrangement of the optical structure 14 is shown in FIG. 6A. As the angle φ increases, the position of the second portion 20 changes.

Figure 6B:
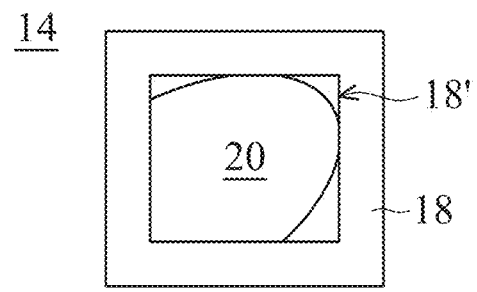

When the angle φ is increased to 30 degrees, the arrangement of the optical structure 14 is shown in FIG. 6B.

Figure 6C:
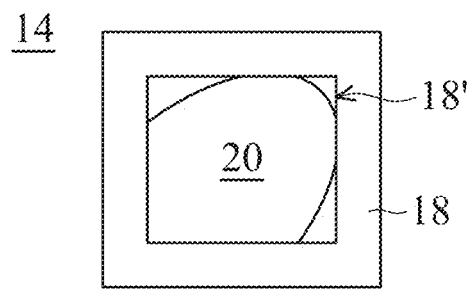

When the angle φ is increased to 45 degrees, the arrangement of the optical structure 14 is shown in FIG. 6C.

Figure 6D:
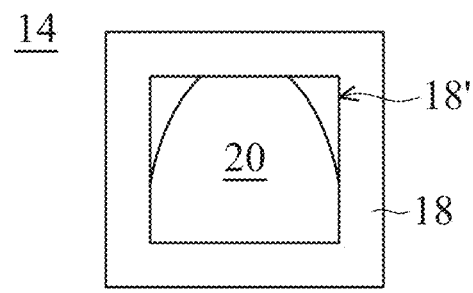

When the angle φ is increased to 90 degrees, the arrangement of the optical structure 14 is shown in FIG. 6D.

Referring to FIGS. 7A-7D, in accordance with various embodiments of the present invention, various arrangements of a first portion 18 and a second portion 20 of an optical structure 14 are provided. FIGS. 7A-7D show top views of the arrangements of the first portion 18 and the second portion 20 of the optical structure 14.

In FIGS. 7A-7D, the first portion 18 surrounds the second portion 20, and the first portion 18 includes a closed ring, for example, a closed ring having a circular ring-shaped opening 18". The second portion 20 partially covers the first portion 18.

Figure 7A:
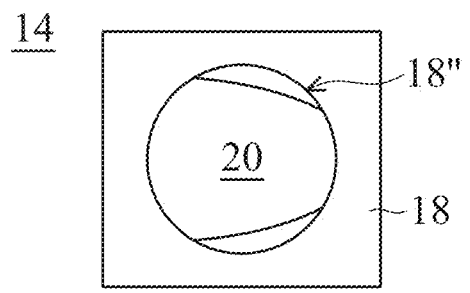
FIGS. 7A-7D show top views of arrangements of a first portion and a second portion of an optical structure in accordance with various embodiments of the present invention.

When the angle φ is zero degrees, the arrangement of the optical structure 14 is shown in FIG. 7A. As the angle φ increases, the position of the second portion 20 changes.

Figure 7B:
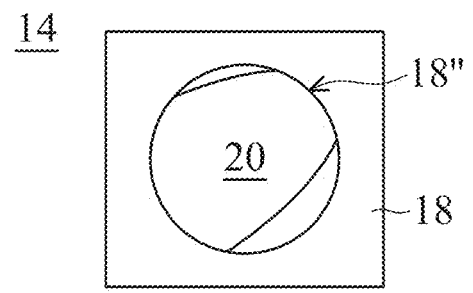

When the angle φ is increased to 30 degrees, the arrangement of the optical structure 14 is shown in FIG. 7B.

Figure 7C:
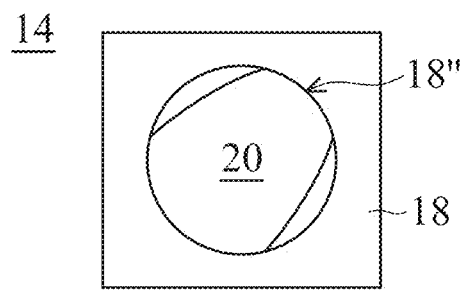

When the angle φ is increased to 45 degrees, the arrangement of the optical structure 14 is shown in FIG. 7C.

Figure 7D:
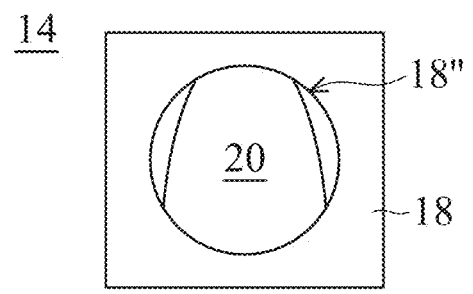

When the angle φ is increased to 90 degrees, the arrangement of the optical structure 14 is shown in FIG. 7D.

In some embodiments, when the first portion 18 includes a closed ring, other opening shapes formed therein are also applicable, for example, an elliptical ring-shaped opening or an aspherical ring-shaped opening.

Figure 8A:
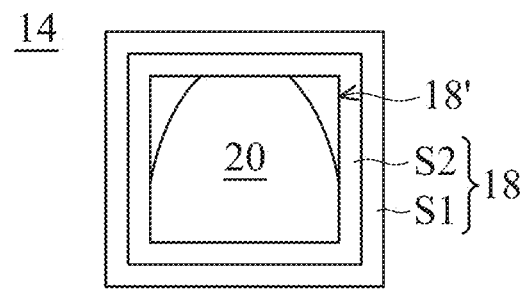
FIG. 8A shows a top view of an arrangement of a first portion and a second portion of an optical structure in accordance with one embodiment of the present invention.
Figure 8B:
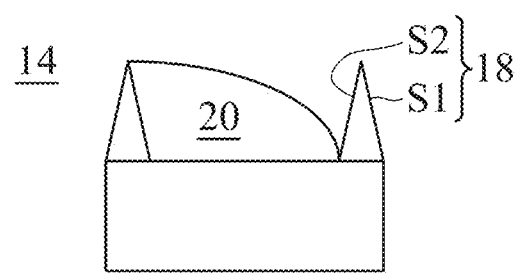
FIG. 8B shows a cross-sectional view of an arrangement of a first portion and a second portion of an optical structure in accordance with one embodiment of the present invention.

Referring to FIGS. 8A and 8B, in accordance with one embodiment of the present invention, an arrangement of a first portion 18 and a second portion 20 of an optical structure 14 is provided. FIG. 8A shows a top view of the arrangement of the first portion 18 and the second portion 20 of the optical structure 14. FIG. 8B shows a cross-sectional views of the arrangement of the first portion 18 and the second portion 20 of the optical structure 14.

In FIGS. 8A and 8B, the first portion 18 is a pointed structure including sidewalls S1 and S2. The first portion 18 surrounds the second portion 20, and the first portion 18 includes a closed ring, for example, a closed ring having a square ring-shaped opening 18'. The second portion 20 partially covers the first portion 18.

FIG. 8A shows the arrangement of the optical structure 14, and the angle φ is 90 degrees.

Figure 9:
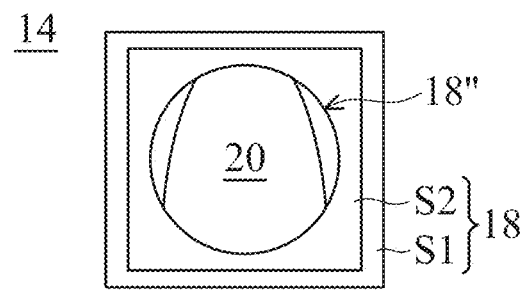
FIG. 9 shows a top view of an arrangement of a first portion and a second portion of an optical structure in accordance with one embodiment of the present invention.

Referring to FIG. 9, in accordance with one embodiment of the present invention, an arrangement of a first portion 18 and a second portion 20 of an optical structure 14 is provided. FIG. 9 shows a top view of the arrangement of the first portion 18 and the second portion 20 of the optical structure 14.

In FIG. 9, the first portion 18 is a pointed structure including sidewalls S1 and S2. The first portion 18 surrounds the second portion 20, and the first portion 18 includes a closed ring, for example, a closed ring having a circular ring-shaped opening 18". The second portion 20 partially covers the first portion 18.

FIG. 9 shows the arrangement of the optical structure 14, and the angle φ is 90 degrees.

Referring to FIGS. 10A-10D, in accordance with various embodiments of the present invention, various arrangements of a first portion 18 and a second portion 20 of an optical structure 14 are provided. FIGS. 10A-10D show top views of the arrangements of the first portion 18 and the second portion 20 of the optical structure 14.

Figure 10A:
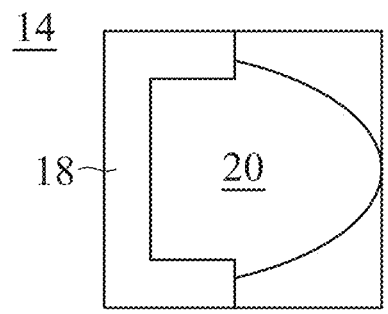
FIGS. 10A-10D show top views of arrangements of a first portion and a second portion of an optical structure in accordance with various embodiments of the present invention.
Figure 10B:
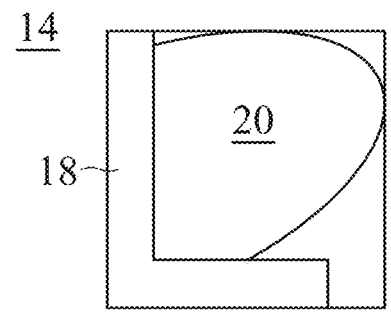
Figure 10C:
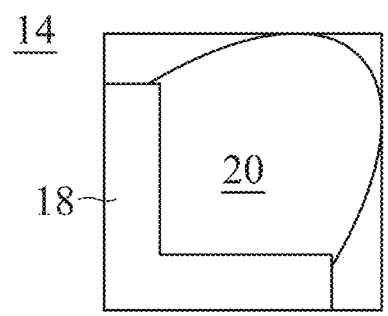
Figure 10D:
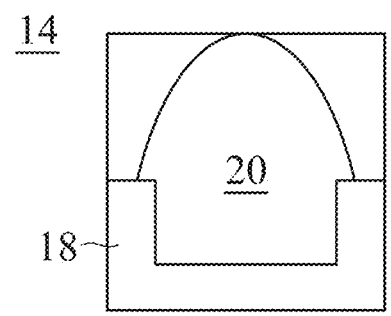

In FIG. 10A, the first portion 18 includes a U shape, and the angle φ is zero degrees. As the angle φ increases, the shape and position of the first portion 18 change. For example, in FIG. 10B, when the angle φ is increased to 30 degrees, the first portion 18 changes to an L shape. In FIG. 10C, when the angle φ is increased to 45 degrees, the first portion 18 remains L-shaped. In FIG. 10D, when the angle (is increased to 90 degrees, the first portion 18 returns to a U shape.

Referring to FIGS. 11A-11D, in accordance with various embodiments of the present invention, various arrangements of a first portion 18 and a second portion 20 of an optical structure 14 are provided. FIGS. 11A-11D show top views of the arrangements of the first portion 18 and the second portion 20 of the optical structure 14.

Figure 11A:
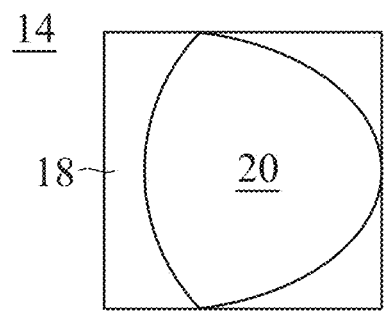
FIGS. 11A-11D show top views of arrangements of a first portion and a second portion of an optical structure in accordance with various embodiments of the present invention.
Figure 11B:
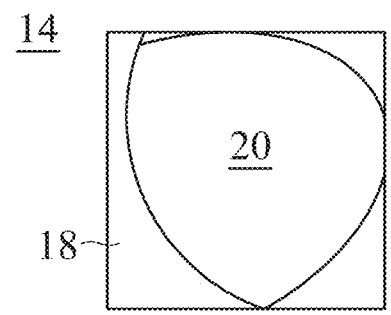
Figure 11C:
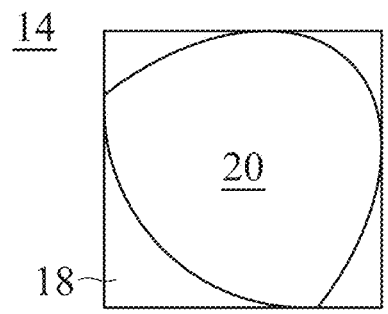
Figure 11D:
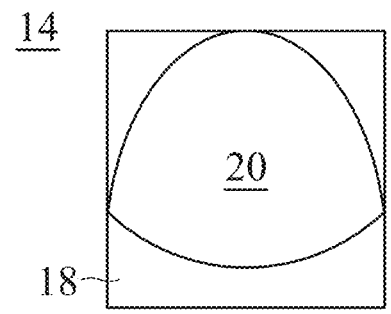

In FIG. 11A, the first portion 18 includes an irregular shape with a curved surface, and the angle φ is zero degrees. As the angle φ increases (for example, φ=30°, 45° and 90°), the shape and position of the first portion 18 change, as shown in FIG. 11B (φ=30°), FIG. 11C (φ=45°) and FIG. 11D (φ=90°).

Referring to FIGS. 12A-12D, in accordance with various embodiments of the present invention, various arrangements of a first portion 18 and a second portion 20 of an optical structure 14 are provided. FIGS. 12A-12D show top views of the arrangements of the first portion 18 and the second portion 20 of the optical structure 14.

Figure 12A:
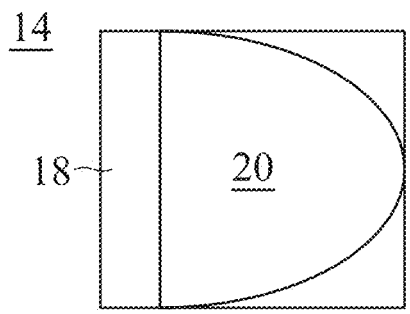
FIGS. 12A-12D show top views of arrangements of a first portion and a second portion of an optical structure in accordance with various embodiments of the present invention.
Figure 12B:
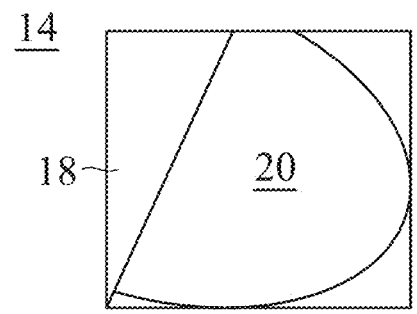
Figure 12C:
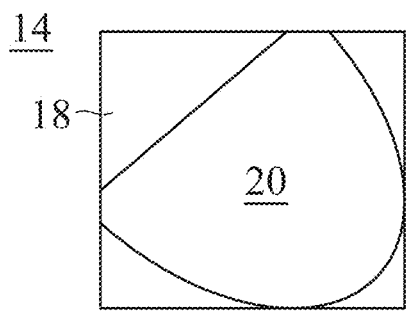
Figure 12D:
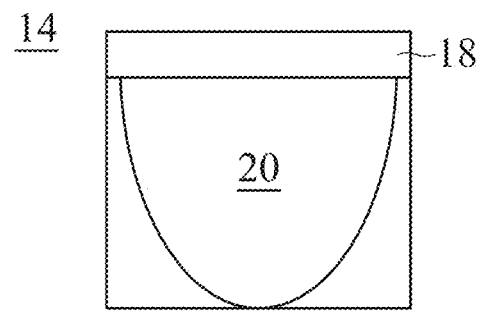

In FIG. 12A, the first portion 18 includes a rectangle, and the angle φ is zero degrees. As the angle φ increases, the shape and position of the first portion 18 change. For example, in FIG. 12B, when the angle φ is increased to 330 degrees, the first portion 18 changes to a triangle. In FIG. 12C, when the angle φ is increased to 315 degrees, the first portion 18 remains a triangle. In FIG. 12D, when the angle φ is increased to 270 degrees, the first portion 18 returns to a rectangle.

Figure 13A:
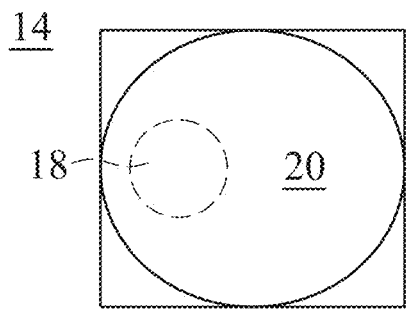
FIGS. 13A-13E show top views of arrangements of a first portion and a second portion of an optical structure in accordance with various embodiments of the present invention.
Figure 13B:
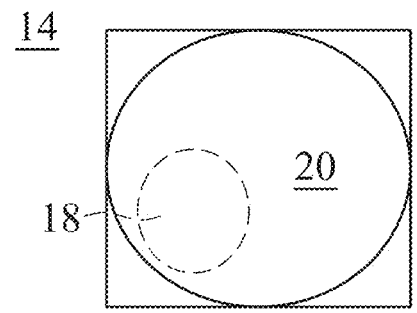
Figure 13C:
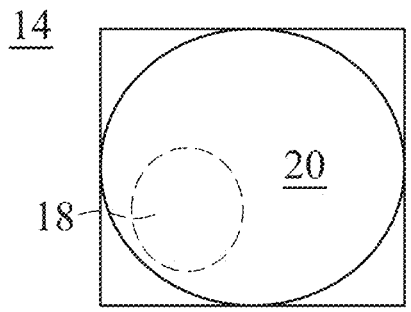
Figure 13D:
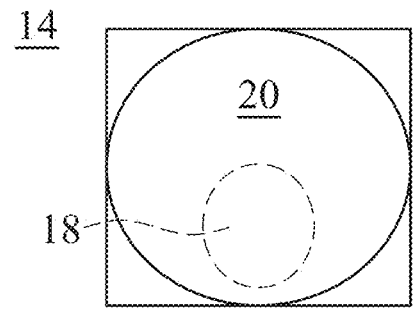
Figure 13E:
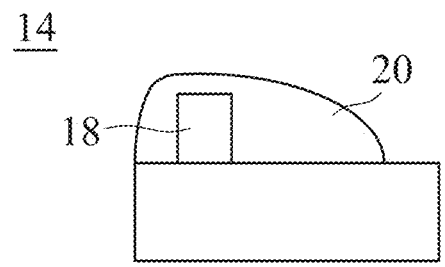

Referring to FIGS. 13A-13E, in accordance with various embodiments of the present invention, various arrangements of a first portion 18 and a second portion 20 of an optical structure 14 are provided. FIGS. 13A-13D show top views of the arrangements of the first portion 18 and the second portion 20 of the optical structure 14. FIG. 13E shows a cross-sectional view of the arrangements of the first portion 18 and the second portion 20 of the optical structure 14.

In FIGS. 13A-13E, the second portion 20 fully covers the first portion 18, and the first portion 18 includes a cylinder.

When the angle φ is zero degrees, the arrangement of the optical structure 14 is shown in FIG. 13A. As the angle φ increases, the positions of the first portion 18 and the second portion 20 change.

When the angle φ is increased to 30 degrees, the arrangement of the optical structure 14 is shown in FIG. 13B.

When the angle φ is increased to 45 degrees, the arrangement of the optical structure 14 is shown in FIG. 13C.

When the angle φ is increased to 90 degrees, the arrangement of the optical structure 14 is shown in FIG. 13D.

Referring to FIGS. 14A-14D, in accordance with various embodiments of the present invention, various arrangements of a first portion 18 and a second portion 20 of an optical structure 14 are provided. FIGS. 14A-14D show top views of the arrangements of the first portion 18 and the second portion 20 of the optical structure 14.

In FIGS. 14A-14D, the second portion 20 fully covers the first portion 18, and the first portion 18 includes a single square column.

Figure 14A:
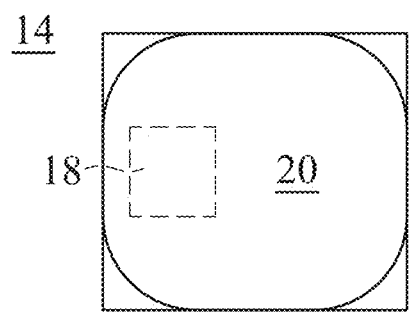
FIGS. 14A-14D show top views of arrangements of a first portion and a second portion of an optical structure in accordance with various embodiments of the present invention.

When the angle ϕ is zero degrees, the arrangement of the optical structure 14 is shown in FIG. 14A. As the angle ϕ increases, the positions of the first portion 18 and the second portion 20 change.

Figure 14B:
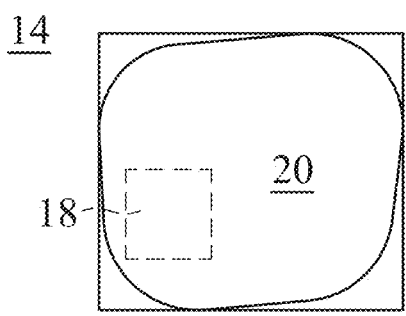

When the angle ϕ is increased to 30 degrees, the arrangement of the optical structure 14 is shown in FIG. 14B.

Figure 14C:
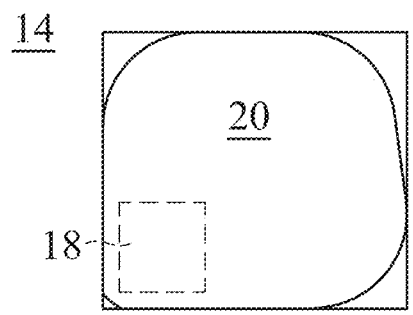

When the angle ϕ is increased to 45 degrees, the arrangement of the optical structure 14 is shown in FIG. 14C.

Figure 14D:
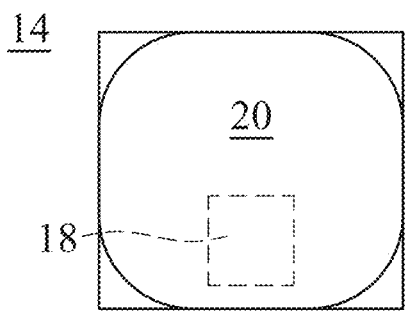

When the angle ϕ is increased to 90 degrees, the arrangement of the optical structure 14 is shown in FIG. 14D.

Figure 15A:
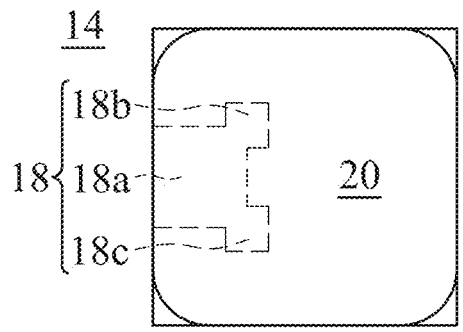
FIG. 15A shows a top view of an arrangement of a first portion and a second portion of an optical structure in accordance with one embodiment of the present invention.

Referring to FIG. 15A, in accordance with one embodiment of the present invention, an arrangement of a first portion 18 and a second portion 20 of an optical structure 14 is provided. FIG. 15A shows a top view of the arrangement of the first portion 18 and the second portion 20 of the optical structure 14.

In FIG. 15A, the second portion 20 fully covers the first portion 18, and the first portion 18 includes multiple square columns. The number of the square columns may be two, three or more. In FIG. 15A, the first portion 18 including triple square columns (18a, 18b and 18c) connected to each other is exemplary. The second portion 20 includes a square-column structure before reflow (not shown). After reflow, the arrangement of the optical structure 14 is shown in FIG. 15A, and the angle (is zero degrees.

Figure 15B:
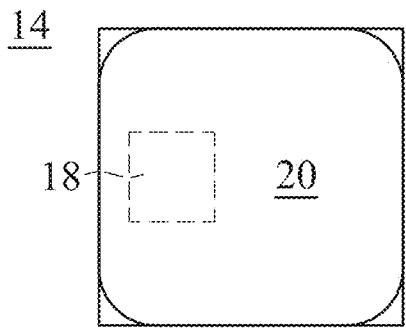
FIG. 15B shows a top view of an arrangement of a first portion and a second portion of an optical structure in accordance with one embodiment of the present invention.

Referring to FIG. 15B, in accordance with one embodiment of the present invention, an arrangement of a first portion 18 and a second portion 20 of an optical structure 14 is provided. FIG. 15B shows a top view of the arrangement of the first portion 18 and the second portion 20 of the optical structure 14.

In FIG. 15B, the second portion 20 fully covers the first portion 18. The first portion 18 includes a single square column. The second portion 20 includes a multiple square-column structure before reflow (not shown). The number of the multiple square columns may be two, three or more, for example, triple square columns connected to each other. After reflow, the arrangement of the optical structure 14 is shown in FIG. 15B, and the angle ϕ is zero degrees.

Referring to FIGS. 16A-16D, in accordance with various embodiments of the present invention, various arrangements of a first portion 18 and a second portion 20 of an optical structure 14 are provided. FIGS. 16A-16D show top views of the arrangements of the first portion 18 and the second portion 20 of the optical structure 14.

In FIGS. 16A-16D, the second portion 20 fully covers the first portion 18, and the first portion 18 includes a single square column. The second portion 20 includes multiple separated structures before reflow (not shown). After reflow, the arrangements of the optical structure 14 are shown in FIGS. 16A-16D.

Figure 16A:
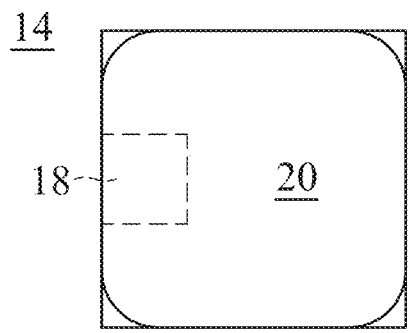
FIGS. 16A-16D show top views of arrangements of a first portion and a second portion of an optical structure in accordance with various embodiments of the present invention.

When the angle ϕ is zero degrees, the arrangement of the optical structure 14 is shown in FIG. 16A. As the angle ϕ increases, the positions of the first portion 18 and the second portion 20 change.

Figure 16B:
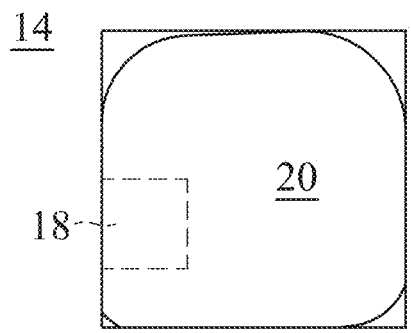

When the angle ϕ is increased to 30 degrees, the arrangement of the optical structure 14 is shown in FIG. 16B.

Figure 16C:
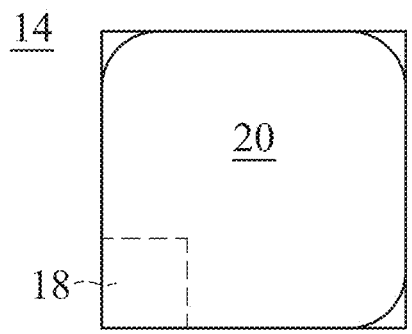

When the angle ϕ is increased to 45 degrees, the arrangement of the optical structure 14 is shown in FIG. 16C.

Figure 16D:
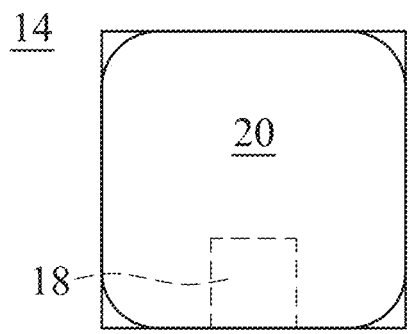

When the angle ϕ is increased to 90 degrees, the arrangement of the optical structure 14 is shown in FIG. 16D.

Figure 17A:
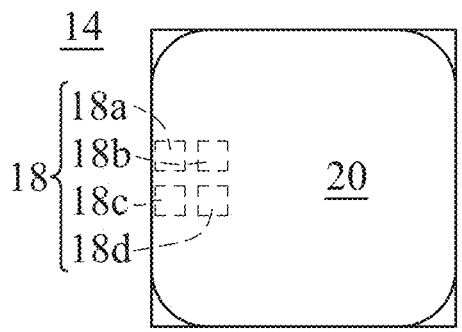
FIG. 17A shows a top view of an arrangement of a first portion and a second portion of an optical structure in accordance with one embodiment of the present invention.

Referring to FIG. 17A, in accordance with one embodiment of the present invention, an arrangement of a first portion 18 and a second portion 20 of an optical structure 14 is provided. FIG. 17A shows a top view of the arrangement of the first portion 18 and the second portion 20 of the optical structure 14.

In FIG. 17A, the second portion 20 fully covers the first portion 18, and the first portion 18 includes multiple square columns. The number of the square columns may be two, three or more. In FIG. 17A, the first portion 18 including quadruple square columns (18a, 18b, 18c and 18d) separated from each other is exemplary. The second portion 20 includes multiple separated structures before reflow (not shown). After reflow, the arrangement of the optical structure 14 is shown in FIG. 17A, and the angle (i is zero degrees.

Figure 17B:
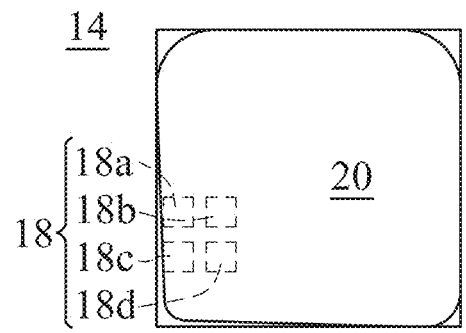
FIG. 17B shows a top view of an arrangement of a first portion and a second portion of an optical structure in accordance with one embodiment of the present invention.

Referring to FIG. 17B, in accordance with one embodiment of the present invention, an arrangement of a first portion 18 and a second portion 20 of an optical structure 14 is provided. FIG. 17B shows a top view of the arrangement of the first portion 18 and the second portion 20 of the optical structure 14.

In FIG. 17B, the second portion 20 fully covers the first portion 18, and the first portion 18 includes multiple square columns. The number of the square columns may be two, three or more. In FIG. 17B, the first portion 18 including quadruple square columns (18a, 18b, 18c and 18d) separated from each other is exemplary. The second portion 20 includes an L-shape structure before reflow (not shown). After reflow, the arrangement of the optical structure 14 is shown in FIG. 17B, and the angle ϕ is 30 degrees.

Figure 17C:
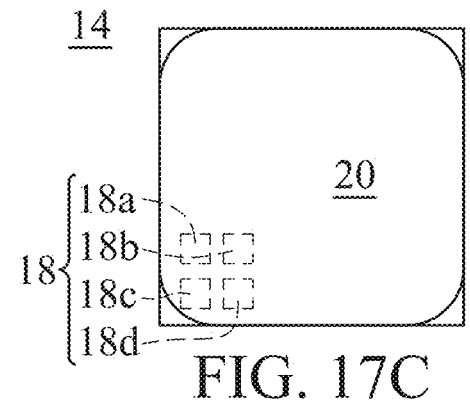
FIG. 17C shows a top view of an arrangement of a first portion and a second portion of an optical structure in accordance with one embodiment of the present invention.

Referring to FIG. 17C, in accordance with one embodiment of the present invention, an arrangement of a first portion 18 and a second portion 20 of an optical structure 14 is provided. FIG. 17C shows a top view of the arrangement of the first portion 18 and the second portion 20 of the optical structure 14.

In FIG. 17C, the second portion 20 fully covers the first portion 18, and the first portion 18 includes multiple square columns. The number of the square columns may be two, three or more. In FIG. 17C, the first portion 18 including quadruple square columns (18a, 18b, 18c and 18d) separated from each other is exemplary. The second portion 20 includes two separated rectangular structures before reflow (not shown). After reflow, the arrangement of the optical structure 14 is shown in FIG. 17C, and the angle ϕ is 45 degrees.

Figure 18A:
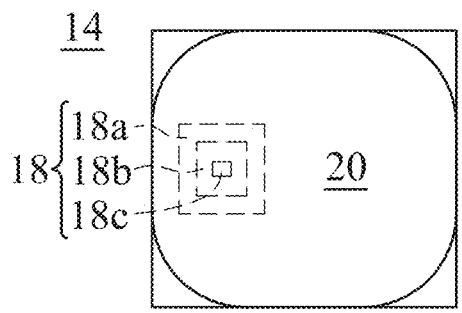
FIG. 18A shows a top view of an arrangement of a first portion and a second portion of an optical structure in accordance with one embodiment of the present invention.
Figure 18B:
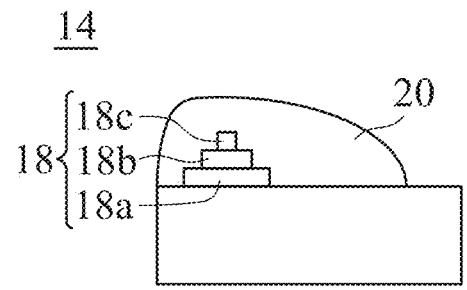
FIG. 18B shows a cross-sectional view of an arrangement of a first portion and a second portion of an optical structure in accordance with one embodiment of the present invention.

Referring to FIGS. 18A and 18B, in accordance with one embodiment of the present invention, an arrangement of a first portion 18 and a second portion 20 of an optical structure 14 is provided. FIG. 18A shows a top view of the arrangement of the first portion 18 and the second portion 20 of the optical structure 14. FIG. 18B shows a cross-sectional view of the arrangement of the first portion 18 and the second portion 20 of the optical structure 14.

In FIGS. 18A and 18B, the second portion 20 fully covers the first portion 18, and the first portion 18 includes a stack of multiple square columns. The number of the square columns may be two, three or more. In FIGS. 18A and 18B, the first portion 18 including triple square columns (18a. 18b and 18c) stacked on top of each other is exemplary. The triple square columns may have the same or different materials and refractive indices. The second portion 20 includes a square-column structure before reflow (not shown). After reflow, the arrangement of the optical structure 14 is shown in FIG. 18A, and the angle ϕ is zero degrees.

Figure 18C:
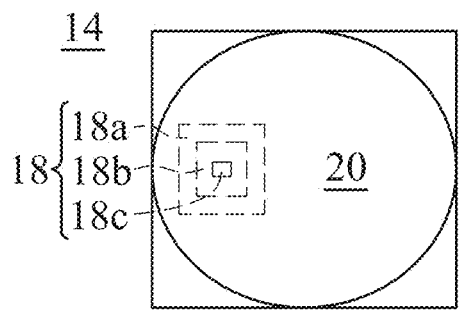
FIG. 18C shows a top view of an arrangement of a first portion and a second portion of an optical structure in accordance with one embodiment of the present invention.

Referring to FIG. 18C, in accordance with one embodiment of the present invention, an arrangement of a first portion 18 and a second portion 20 of an optical structure 14 is provided. FIG. 18C shows a top view of the arrangement of the first portion 18 and the second portion 20 of the optical structure 14.

In FIG. 18C, the second portion 20 fully covers the first portion 18, and the first portion 18 includes a stack of multiple square columns. The number of the square columns may be two, three or more. In FIG. 18C, the first portion 18 including triple square columns (18a, 18b and 18c) stacked on top of each other is exemplary. The triple square columns may have the same or different materials and refractive indices. The second portion 20 includes a cylindrical structure before reflow (not shown). After reflow, the arrangement of the optical structure 14 is shown in FIG. 18C, and the angle φ is zero degrees.

Figure 19A:
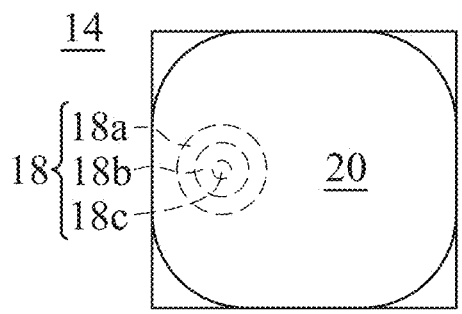
FIG. 19A shows a top view of an arrangement of a first portion and a second portion of an optical structure in accordance with one embodiment of the present invention.

Referring to FIG. 19A, in accordance with one embodiment of the present invention, an arrangement of a first portion 18 and a second portion 20 of an optical structure 14 is provided. FIG. 19A shows a top view of the arrangement of the first portion 18 and the second portion 20 of the optical structure 14.

In FIG. 19A, the second portion 20 fully covers the first portion 18, and the first portion 18 includes a stack of multiple cylinders. The number of the cylinders may be two, three or more. In FIG. 19A, the first portion 18 including triple cylinders (18a, 18b and 18c) stacked on top of each other is exemplary. The triple cylinders may have the same or different materials and refractive indices. The second portion 20 includes a square-column structure before reflow (not shown). After reflow, the arrangement of the optical structure 14 is shown in FIG. 19A, and the angle φ is zero degrees.

Figure 19B:
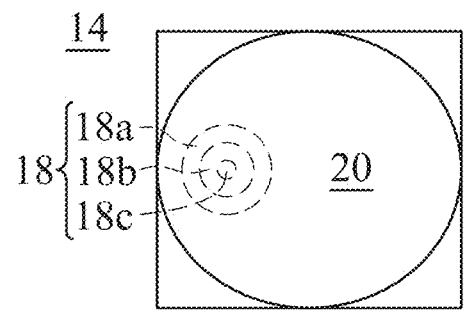
FIG. 19B shows a top view of an arrangement of a first portion and a second portion of an optical structure in accordance with one embodiment of the present invention.

Referring to FIG. 19B, in accordance with one embodiment of the present invention, an arrangement of a first portion 18 and a second portion 20 of an optical structure 14 is provided. FIG. 19B shows a top view of the arrangement of the first portion 18 and the second portion 20 of the optical structure 14.

In FIG. 19B, the second portion 20 fully covers the first portion 18, and the first portion 18 includes a stack of multiple cylinders. The number of the cylinders may be two, three or more. In FIG. 19B, the first portion 18 including triple cylinders (18a, 18b and 18c) stacked on top of each other is exemplary. The triple cylinders may have the same or different materials and refractive indices. The second portion 20 includes a cylindrical structure before reflow (not shown). After reflow, the arrangement of the optical structure 14 is shown in FIG. 19B, and the angle φ is zero degrees.

Figure 20:
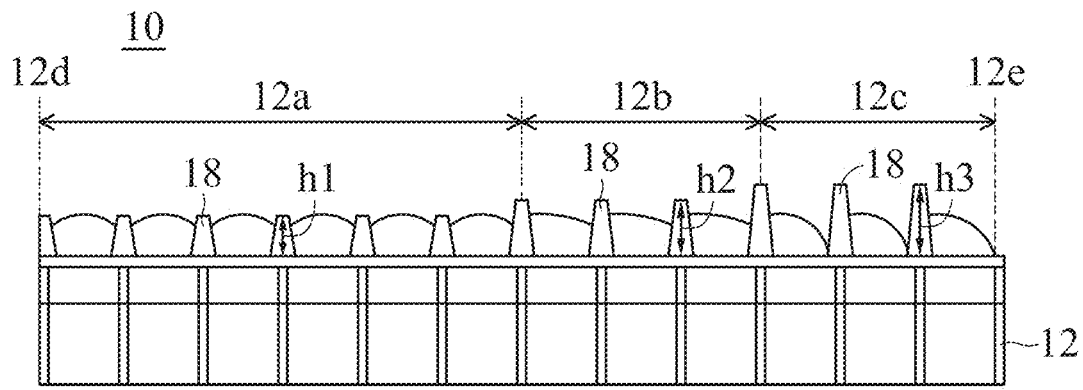
FIG. 20 shows a cross-sectional view of an optical device in accordance with one embodiment of the present invention.

Referring to FIG. 20, in accordance with one embodiment of the present invention, an optical device 10 is provided. FIG. 20 shows a cross-sectional view of the optical device 10.

In some embodiments, when the first portion 18 is a columnar structure, the second portion 20 fully covers the first portion 18. In some embodiments, the columnar structure includes a cylinder, a cone, a single square column or multiple square columns. In some embodiments, the columnar structure includes a stack of multiple square columns or a stack of multiple cylinders.

As shown in FIG. 20, the substrate 12 includes a first region 12a, a second region 12b and a third region 12c from the center 12d to the edge 12e of the substrate 12. In FIG. 20, the first portion 18 of each optical structure 14 disposed within the first region 12a has a first height h1. The first portion 18 of each optical structure 14 disposed within the second region 12b has a second height h2. The first portion 18 of each optical structure 14 disposed within the third region 12c has a third height h3. Specifically, the third height h3 is higher than the second height h2, and the second height h2 is higher than the first height h1.

Figure 21:
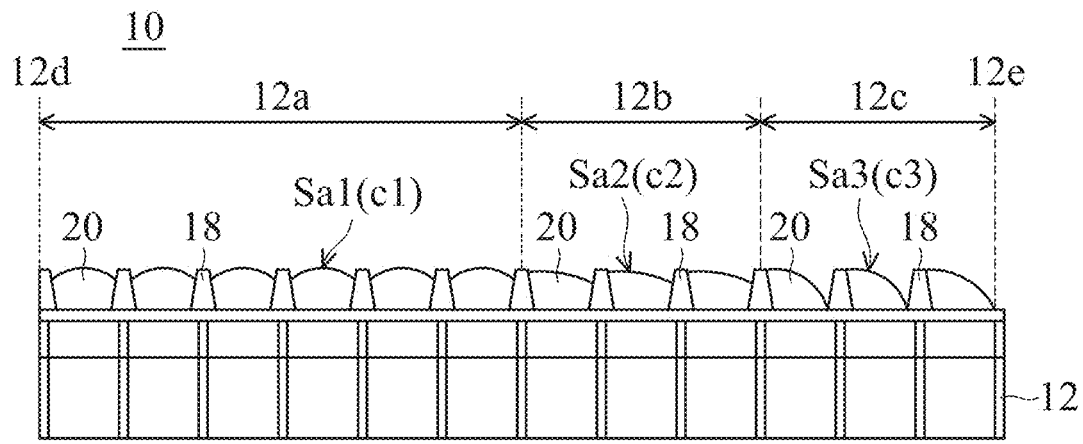
FIG. 21 shows a cross-sectional view of an optical device in accordance with one embodiment of the present invention.

Referring to FIG. 21, in accordance with one embodiment of the present invention, an optical device 10 is provided. FIG. 21 shows a cross-sectional view of the optical device 10.

As shown in FIG. 21, the substrate 12 includes a first region 12a, a second region 12b and a third region 12c from the center 12d to the edge 12e of the substrate 12. In FIG. 21, the spherical surface Sa1 of the second portion 20 of each optical structure 14 disposed within the first region 12a has a first curvature c1. The spherical surface Sa2 of the second portion 20 of each optical structure 14 disposed within the second region 12b has a second curvature c2. The spherical surface Sa3 of the second portion 20 of each optical structure 14 disposed within the third region 12c has a third curvature c3. Specifically, the third curvature c3 is greater than the second curvature c2, and the second curvature c2 is greater than the first curvature c1.

Figure 22:
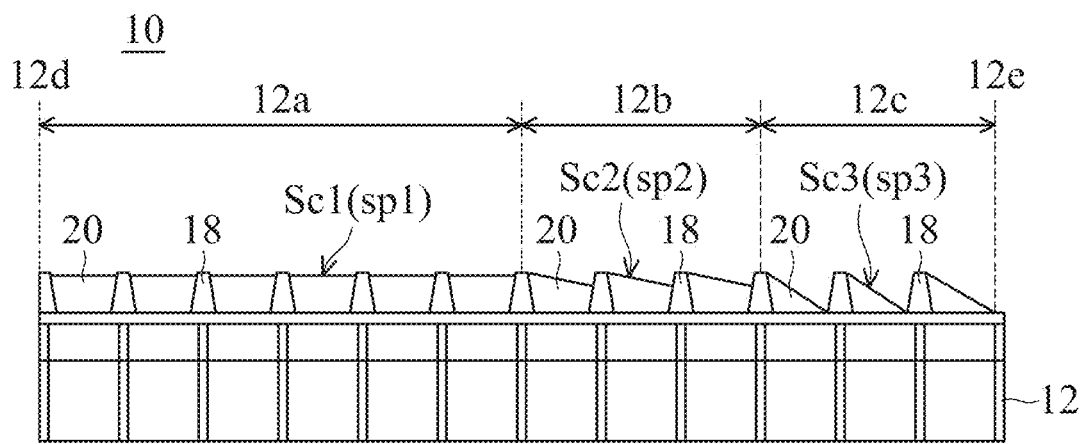
FIG. 22 shows a cross-sectional view of an optical device in accordance with one embodiment of the present invention.

Referring to FIG. 22, in accordance with one embodiment of the present invention, an optical device 10 is provided. FIG. 22 shows a cross-sectional view of the optical device 10.

As shown in FIG. 22, the substrate 12 includes a first region 12a, a second region 12b and a third region 12c from the center 12d to the edge 12e of the substrate 12. In FIG. 22, the inclined surface Sc of the second portion 20 of each optical structure 14 disposed within the first region 12a has a first slope sp1. The inclined surface Sc2 of the second portion 20 of each optical structure 14 disposed within the second region 12b has a second slope sp2. The inclined surface Sc3 of the second portion 20 of each optical structure 14 disposed within the third region 12c has a third slope sp3. Specifically, the third slope sp3 is greater than the second slope sp2, and the second slope sp2 is greater than the first slope sp1.

Figure 23:
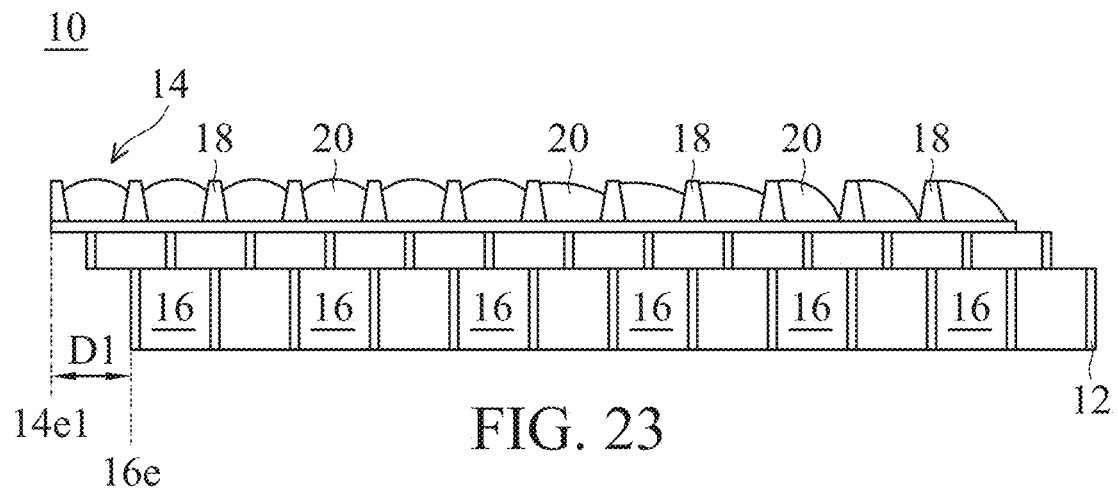
FIG. 23 shows a cross-sectional view of an optical device in accordance with one embodiment of the present invention.

Referring to FIG. 23, in accordance with one embodiment of the present invention, an optical device 10 is provided. FIG. 23 shows a cross-sectional view of the optical device 10.

In FIG. 23, the photoelectric conversion element 16 closest to the center of the wafer have a boundary 16e. The optical structure 14 closest to the center of the wafer has a boundary 14e1. Specifically, the boundary 16e of the photoelectric conversion element 16 closest to the center of the wafer and the boundary 14e1 of the optical structure 14 closest to the center of the wafer have a distance D1 therebetween.

Figure 24:
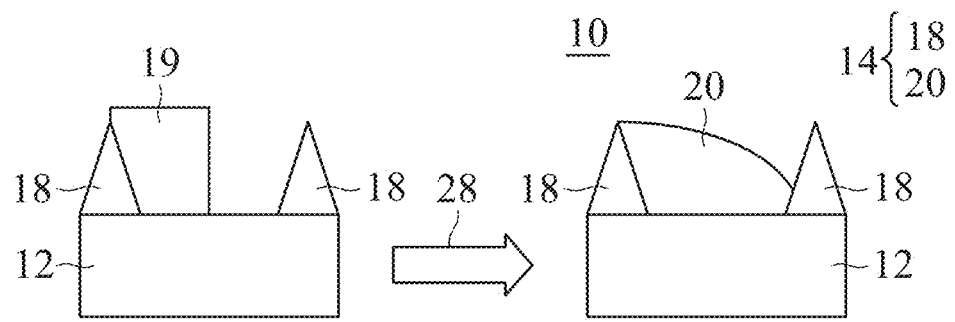
FIG. 24 shows a cross-sectional view of a method for fabricating an optical device in accordance with one embodiment of the present invention.

Referring to FIG. 24, in accordance with one embodiment of the present invention, a method for fabricating an optical device 10 is provided. FIG. 24 shows a cross-sectional view of the fabrication method.

As shown in FIG. 24, a substrate 12 is provided. Next, a first material 18 having a first glass transition temperature is formed above the substrate 12. Next, a second material 19 having a second glass transition temperature is formed above the substrate 12. The first glass transition temperature is higher than the second glass transition temperature. Next, a heating process 28 is performed to form a plurality of optical structures 14 including a first portion 18 and a second portion 20. Therefore, the fabrication of the optical device 10 is complete.

In some embodiments, the heating process 28 includes lamp irradiation, laser irradiation, electricity conduction or liquid dissolving. In some embodiments, the liquid dissolving includes physical etching or chemical etching.

In some embodiments, the fabrication method further includes adjusting the volume of the second material 19 before the heating process 28. In some embodiments, when the second material 19 has the same height, by adjusting different volumes, after the heating process 28, the second portions 20 with different curvatures are obtained. For example, the larger the volume, the smaller the curvature.

In some embodiments, the fabrication method further includes adjusting the height of the second material 19 before the heating process 28. In some embodiments, when the second material 19 has the same volume, by adjusting different heights, after the heating process 28, the second portions 20 with different curvatures are obtained. For example, the lower the height, the smaller the curvature.

In some embodiments, the heating process 28 includes applying different levels of heating energy. In some embodiments, when the second material 19 has the same height and volume, by applying different heating energy, second portions 20 with different curvatures are obtained. For example, the greater the heating energy, the smaller the curvature.

Figure 25:
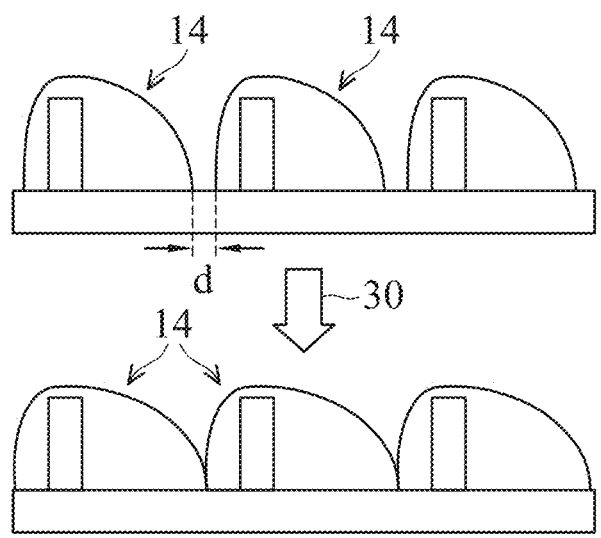
FIG. 25 shows a cross-sectional view of a method for fabricating an optical device in accordance with one embodiment of the present invention.

Referring to FIG. 25, the fabrication method further includes performing an etching process 30 after the heating process 28. In some embodiments, after the heating process 28, there is a gap d between the adjacent optical structures 14. The etching process 30 eliminates the gap d and the adjacent optical structures 14 can thus be close together and have the best appearance.

Example 1

AFM Profile (1) of an Optical Structure after Reflow

Figure 26:
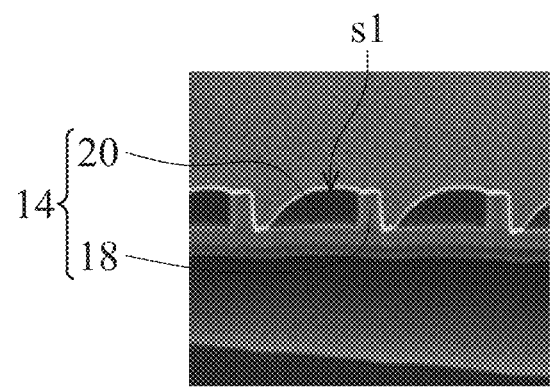
FIG. 26 shows a AFM profile of an optical structure after reflow.

The process of Example 1 is similar to FIG. 24, for example, a substrate was provided. Next, a first material was formed above the substrate. Next, a second material was formed above the substrate. Next, a heating process (i.e. a reflow process) with a low temperature was performed to form a plurality of optical structures 14 including a first portion 18 and a second portion 20, as shown in FIG. 26. FIG. 26 shows the atomic force microscope (AFM) profile of the optical structure 14 after reflow. In FIG. 26 (comparable to FIG. 4B), the surface of the second portion 20 of each optical structure 14 has a first curvature s1.

Example 2

AFM Profile (2) of an Optical Structure after Reflow

Figure 27:
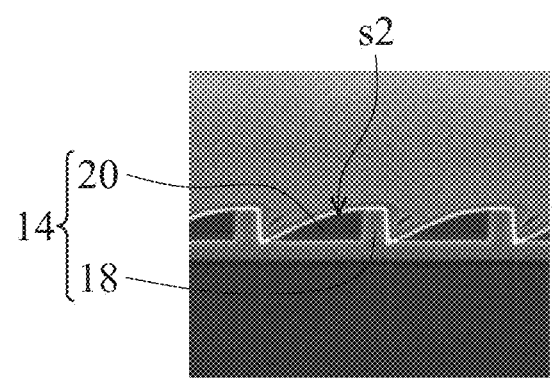
FIG. 27 shows a AFM profile of an optical structure after reflow.

The process of Example 2 is similar to FIG. 24, a substrate was provided. Next, a first material was formed above the substrate. Next, a second material was formed above the substrate. Next, a heating process (i.e. a reflow process) with a medium temperature (i.e. the temperature higher than Example 1) was performed to form a plurality of optical structures 14 including a first portion 18 and a second portion 20, as shown in FIG. 27. FIG. 27 shows the atomic force microscope (AFM) profile of the optical structure 14 after reflow. In FIG. 27, the surface of the second portion 20 of each optical structure 14 has a second curvature s2.

Example 3

AFM Profile (3) of an Optical Structure after Reflow

Figure 28:
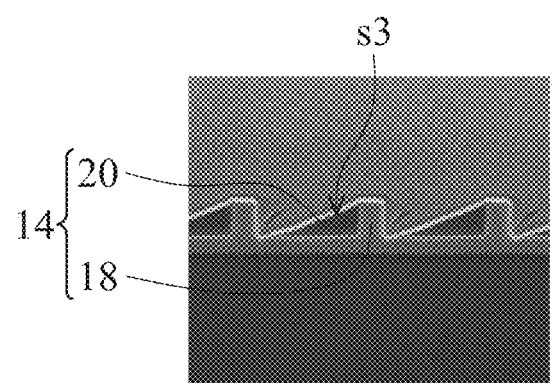
FIG. 28 shows a AFM profile of an optical structure after reflow.

The process of Example 3 is similar to FIG. 24, a substrate was provided. Next, a first material was formed above the substrate. Next, a second material was formed above the substrate. Next, a heating process (i.e. a reflow process) with a high temperature (i.e. the temperature higher than Example 2) was performed to form a plurality of optical structures 14 including a first portion 18 and a second portion 20, as shown in FIG. 28. FIG. 28 shows the atomic force microscope (AFM) profile of the optical structure 14 after reflow.

In FIG. 28 (comparable to FIG. 4C), the surface of the second portion 20 of each optical structure 14 has a third curvature s3. As a result, the first curvature s1 (formed at low-temperature reflow) is greater than the second curvature s2 (formed at medium-temperature reflow), and the second curvature s2 is greater than the third curvature s3 (formed at high-temperature reflow).

In the present invention, the specific dual optical micro structures (with adjustable locations, profiles, dimensions and combinations of components) are arranged above the photoelectric conversion elements of the CMOS image sensor (CIS). The dual optical micro structures can improve the light receiving efficiency and reduce cross-talk in the CIS.

Although some embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. An optical device, comprising:
a substrate comprising a plurality of photoelectric conversion elements and a plurality of pixels; and
a plurality of optical structures disposed above the substrate, each optical structure corresponding to one photoelectric conversion element, wherein each optical structure comprises a first portion having a first glass transition temperature and a second portion having a second glass transition temperature, the second portion guides incident light into the corresponding photoelectric conversion element, and the first glass transition temperature is higher than the second glass transition temperature.

2. The optical device as claimed in claim 1, wherein the first portion and the second portion of each the optical structure are disposed on the same plane.

3. The optical device as claimed in claim 1, wherein the first glass transition temperature is lower than or equal to 350° C. and greater than or equal to 70° C., and the second glass transition temperature is lower than or equal to 300° C. and greater than or equal to 50° C.

4. The optical device as claimed in claim 1, wherein each first portion has a refractive index which is lower than or equal to 2.9 and greater than 1, and each second portion has a refractive index which is lower than or equal to 2.8 and greater than 1.1.

5. The optical device as claimed in claim 1, wherein each first portion comprises a rectangle, a triangle, an isosceles trapezoid or an irregular trapezoid from a cross-sectional view, and each second portion has a flat surface, a convex surface or a concave surface from a cross-sectional view.

6. The optical device as claimed in claim 1, wherein each first portion surrounds each second portion, and when each first portion comprises a closed ring having a circular ring-shaped opening, a square ring-shaped opening, an elliptical ring-shaped opening or an aspherical ring-shaped opening from a top view, each second portion partially covers each first portion.

7. The optical device as claimed in claim 1, wherein each first portion comprises a U shape, an L shape, an irregular shape with a curved surface, a rectangle or a triangle from a top view.

8. The optical device as claimed in claim 1, wherein when each first portion comprises a cylinder, a cone, a single square column, multiple square columns, a stack of multiple square columns or a stack of multiple cylinders, each second portion fully covers each first portion.

9. The optical device as claimed in claim 1, wherein the substrate comprises a first region, a second region and a third region from a center to an edge of the substrate, the first portion of each optical structure disposed within the first region has a first height, the first portion of each optical structure disposed within the second region has a second height and the first portion of each optical structure disposed within the third region has a third height, and the third height is higher than the second height, and the second height is higher than the first height.

10. The optical device as claimed in claim 1, wherein the substrate comprises a first region, a second region and a third region from a center to an edge of the substrate, when the second portion of each optical structure has a spherical surface, the second portion of each optical structure disposed within the first region has a first curvature, the second portion of each optical structure disposed within the second region has a second curvature and the second portion of each optical structure disposed within the third region has a third curvature, and the third curvature is greater than the second curvature, and the second curvature is greater than the first curvature.

11. The optical device as claimed in claim 1, wherein the substrate comprises a first region, a second region and a third region from a center to an edge of the substrate, when the second portion of each optical structure has an inclined surface, the second portion of each optical structure disposed within the first region has a first slope, the second portion of each optical structure disposed within the second region has a second slope and the second portion of each optical structure disposed within the third region has a third slope, and the third slope is greater than the second slope, and the second slope is greater than the first slope.

12. The optical device as claimed in claim 1, wherein the photoelectric conversion element closest to a center of a wafer has a first boundary and the optical structure closest to the center of the wafer has a second boundary, and the first boundary and the second boundary have a horizontal distance therebetween.

13. The optical device as claimed in claim 1, further comprising a plurality of color filters and microlenses, wherein the color filters are disposed between the substrate and the optical structures, and the microlenses are disposed between the color filters and the optical structures.

14. The optical device as claimed in claim 1, wherein angle $\psi$ is defined as an angle between a connecting line connecting a center of the substrate with a center of mass of the optical structure in a pixel and a horizontal line passing through the center of the substrate from a top view, when each first portion surrounds each second portion and each first portion is a closed ring, as the angle $\psi$ changes, each first portion has the same relative position in each pixel, and a position of each second portion changes with the angle $\psi$ in each pixel.

15. The optical device as claimed in claim 1, wherein angle $\psi$ is defined as an angle between a connecting line connecting a center of the substrate with a center of mass of the optical structure in a pixel and a horizontal line passing through the center of the substrate from a top view, when each first portion is a columnar structure and each second portion fully covers each first portion, as the angle $\psi$ changes, each first portion and each second portion have different relative positions with the angle $\psi$ in each pixel.

* * * * *